United States Patent
Tsunoda

(10) Patent No.: US 10,277,387 B2
(45) Date of Patent: *Apr. 30, 2019

(54) SIGNAL RECOVERY CIRCUIT, ELECTRONIC DEVICE, AND SIGNAL RECOVERY METHOD

(71) Applicant: FUJITSU LIMITED, Kawasaki-shi, Kanagawa (JP)

(72) Inventor: Yukito Tsunoda, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/624,743

(22) Filed: Jun. 16, 2017

(65) Prior Publication Data

US 2018/0019864 A1    Jan. 18, 2018

(30) Foreign Application Priority Data

Jul. 15, 2016  (JP) ................. 2016-140478

(51) Int. Cl.
*H04L 7/033* (2006.01)
*H03L 7/095* (2006.01)
(Continued)

(52) U.S. Cl.
CPC .......... *H04L 7/0331* (2013.01); *H03L 7/0807* (2013.01); *H03L 7/087* (2013.01); *H03L 7/095* (2013.01); *H04L 7/0075* (2013.01)

(58) Field of Classification Search
CPC ........ H03L 7/0807; H03L 7/087; H03L 7/095
See application file for complete search history.

(56) References Cited

U.S. PATENT DOCUMENTS 5,414,741 A     5/1995  Johnson
5,633,899 A *   5/1997  Fiedler ................. H03L 7/0891
                                           331/1 A
(Continued)

FOREIGN PATENT DOCUMENTS

JP    6-216765 A    8/1994
JP    8-191247 A    7/1996
(Continued)

OTHER PUBLICATIONS

Ansgar Pottbäcker et al., "A Si Bipolar Phase and Frequency Detector IC for Clock Extraction up to 8 Gb/s", IEEE Journal of Solid-State Circuits, vol. 27, No. 12, Dec. 1992, pp. 1747-1751 (5 pages).

(Continued)

*Primary Examiner* — Ross Varndell
(74) *Attorney, Agent, or Firm* — Fujitsu Patent Center

(57) ABSTRACT

A signal recovery circuit includes an oscillator that generates a first clock of which a frequency is variable, and a feedback circuit that controls the oscillator to synchronize the first clock with input data, depending on a phase relationship between the input data and the first clock, the feedback circuit including a control portion that controls the oscillator depending on the phase relationship between the input data and the first clock, a first phase detection circuit that generates a clock phase control signal depending on the phase relationship between the input data and the first clock, an output data generation circuit that generates output data by latching the input data at a change edge of the first clock, and a lock detection circuit that outputs a lock detection signal indicating whether a state is a lock state or a non-lock state.

7 Claims, 16 Drawing Sheets

(51) Int. Cl.
*H03L 7/087* (2006.01)
*H04L 7/00* (2006.01)
*H03L 7/08* (2006.01)

(56) References Cited

U.S. PATENT DOCUMENTS

| | | |
|---|---|---|
| 5,838,205 A | 11/1998 | Ferraiolo et al. |
| 6,124,762 A | 9/2000 | Yoshida |
| 6,489,851 B1 | 12/2002 | Miyada et al. |
| 7,646,840 B2 | 1/2010 | Hoffmann |
| 9,036,764 B1 | 5/2015 | Hossain et al. |
| 9,565,015 B1 * | 2/2017 | Tsunoda ............... H04L 7/0087 |
| 2002/0051510 A1 | 5/2002 | Noguchi |
| 2002/0057479 A1 | 5/2002 | Takeshita et al. |
| 2002/0061087 A1 | 5/2002 | Williams |
| 2002/0061088 A1 | 5/2002 | Kon |
| 2006/0250192 A1 | 11/2006 | Hsieh |
| 2007/0058768 A1 | 3/2007 | Werner |
| 2007/0121772 A1 | 5/2007 | Wada |
| 2009/0122939 A1 | 5/2009 | Hoang |
| 2011/0096884 A1 * | 4/2011 | Chatwin ............... H03D 13/004 375/360 |
| 2011/0148851 A1 | 6/2011 | Sugiyama et al. |
| 2014/0286469 A1 | 9/2014 | Shibasaki et al. |
| 2017/0244545 A1 * | 8/2017 | Tsunoda ............... H04L 7/0331 |

FOREIGN PATENT DOCUMENTS

| | | |
|---|---|---|
| JP | 9-147499 A | 6/1997 |
| JP | 11-145943 A | 5/1999 |
| JP | 11-261409 | 9/1999 |
| JP | 11-355111 A | 12/1999 |
| JP | 2001-156631 A | 6/2001 |
| JP | 2002-135093 A | 5/2002 |
| JP | 2002-198808 A | 7/2002 |
| JP | 2010-141594 A | 6/2010 |
| JP | 2011-135149 | 7/2011 |
| JP | 2014-187561 A | 10/2014 |

OTHER PUBLICATIONS

U.S. Office Action dated Feb. 8, 2018 for co-pending U.S. Appl. No. 15/399,815, 16 pages.
Notice of Allowance dated Dec. 12, 2016 for co-pending U.S. Appl. No. 15/211,079.
U.S. Office Action dated Jun. 13, 2018 for co-pending US. Appl. No. 15/399,815, 13 pages.
U.S. Office Action dated Jun. 29, 2018 for co-pending US. Appl. No. 15/399,815, 6 pages.
U.S. Office Action dated Jul. 3, 2018 for co-pending US. Appl. No. 15/399,815, 6 pages.
Japanese Office Action dated Mar. 5, 2019 for corresponding Japanese Patent Application No. 2015-177602 with, English Translation, 7 pages.

* cited by examiner

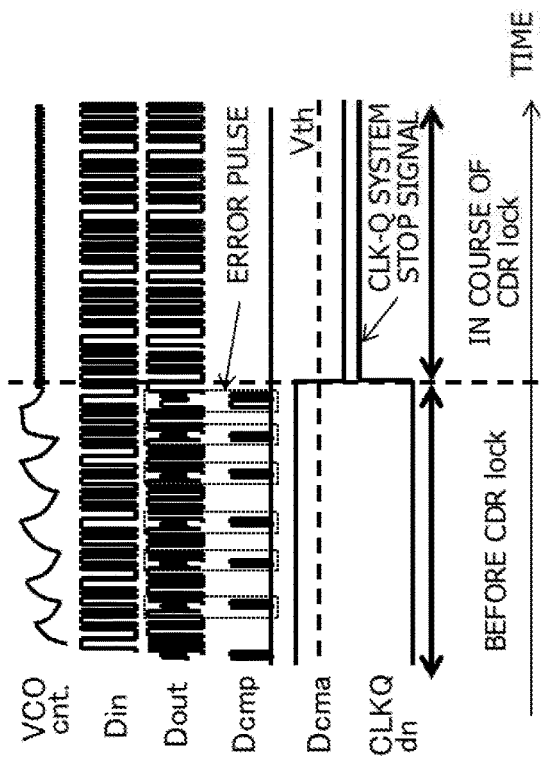
FIG. 6D
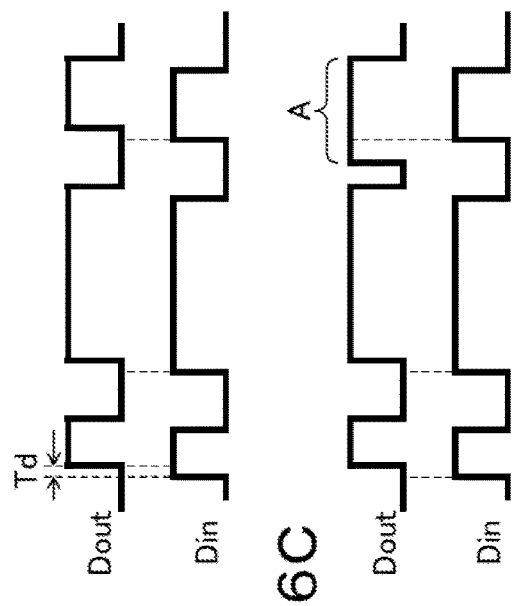
FIG. 6B
FIG. 6C

SIGNAL RECOVERY CIRCUIT, ELECTRONIC DEVICE, AND SIGNAL RECOVERY METHOD

CROSS-REFERENCE TO RELATED APPLICATION

This application is based upon and claims the benefit of priority of the prior Japanese Patent Application No. 2016-140478, filed on Jul. 15, 2016, the entire contents of which are incorporated herein by reference.

FIELD

The embodiments discussed herein are related to a signal recovery (clock and data recovery: CDR) circuit, an electronic device on which a signal recovery circuit is mounted, and a signal recovery method.

BACKGROUND

There is a demand to increase data rates of signal transmission and signal reception inside and outside a device as performance improvement of an information processing apparatus such as a communication-based device or a server. For example, a bit rate is desired to be further heightened, in the field of high-speed I/O that transmits and receives a signal in an integrated circuit chip or between chips (in a device or between devices), or in the field of optical communication.

In a reception circuit, there is a demand to determine the transmitted data at an appropriate timing, and to recover data and clock (clock and data recovery: CDR). CDR is realized by detecting a phase difference and a frequency difference between the input data and the received (sampling) clock, and performing phase adjustment of the sampling clock based on information thereof. Known is a CDR circuit that performs retiming by a clock recovered from input data without using a reference clock even in the reception circuit, and outputs data of which jitter is decreased.

In the CDR circuit, it is known to use a phase detection circuit (phase detector: PD) that detects the phase difference between the input data and the clock. Based on the phase difference detected by the phase detection circuit, the phases and the frequencies of the input data and a first clock are controlled to be matched. A state where the frequencies thereof are matched is referred to as a lock state. Here, a state that is not the lock state is referred to as a non-lock state.

However, the phase detection circuit has problems that a frequency range in which clock recovery is possible is narrow, and it is not possible to detect a change to the non-lock state from the lock state.

The followings are reference documents.
[Document 1] Japanese Laid-open Patent Publication No. 2011-135149, and
[Document 2] Ansgar Pottbacker, et al., "A Si Bipolar Phase and Frequency Detector IC for Clock Extraction up to 8 Gb/s", IEEE Journal of Solid-State Circuits, Vol. 27, No. 12, December 1992.

SUMMARY

According to an aspect of the invention, a signal recovery circuit includes an oscillator that generates a first clock of which a frequency is variable, and a feedback circuit that controls the oscillator to synchronize the first clock with input data, depending on a phase relationship between the input data and the first clock, the feedback circuit including a control portion that controls the oscillator depending on the phase relationship between the input data and the first clock, a first phase detection circuit that generates a clock phase control signal depending on the phase relationship between the input data and the first clock, an output data generation circuit that generates output data by latching the input data at a change edge of the first clock, and a lock detection circuit that outputs a lock detection signal indicating whether a state is a lock state or a non-lock state, based on a comparison result of the input data and the output data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6B is a time chart illustrating a relationship between an input signal and an output signal at the time of a lock state;

FIG. 6C is a time chart illustrating a relationship between the input signal and the output signal at the time of a non-lock state;

FIG. 6D is a time chart illustrating operation of a lock detection circuit at the time of activation of the CDR circuit illustrated in FIG. 5A;

DESCRIPTION OF EMBODIMENTS

Before embodiments will be described, a general signal recovery (CDR) circuit will be described.

Figure 1A:
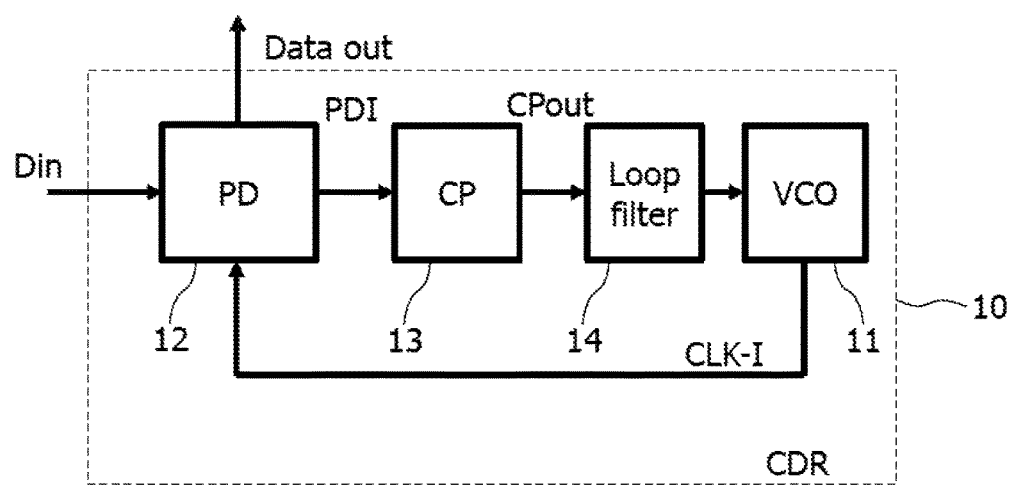
FIG. 1A is a block diagram illustrating a CDR circuit using a phase detection circuit that detects a phase difference between input data and a clock.
Figure 1B:
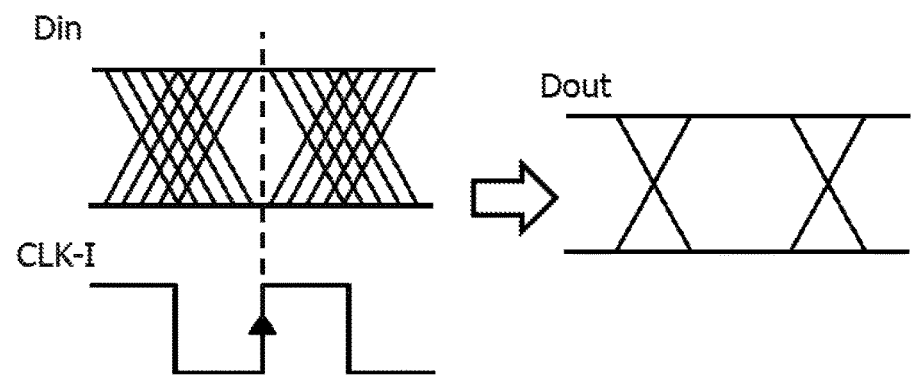
FIG. 1B illustrates a relationship between input data, a clock and output data.

FIG. 1A and FIG. 1B are diagrams illustrating a CDR circuit using a phase detection circuit (phase detector: PD) that detects a phase difference between input data and a clock, FIG. 1A is a block diagram, and FIG. 1B illustrates a relationship between input data, a clock and output data.

As illustrated in FIG. 1A, a CDR circuit 10 includes a voltage control oscillator (VCO) 11, a phase detection circuit (PD) 12, a charge pump (CP) 13, and a loop filter 14. The VCO 11 is not limited to a voltage control as long as a frequency thereof is variable, but since the VCO is widely used, a following example in which the VCO is used will be described. The VCO 11 generates a clock CLK-I, and the frequency of the clock CLK-I is changed by changing a control voltage. The PD 12 detects a phase difference (clock phase control signal) PDI between an input data Din and the clock CLK-I. As described later, here, the PD 12 has a function of a latch circuit, thereby, incorporates the input data Din by synchronizing the input data Din with a change edge of the clock CLK-I, and outputs an output data Dout as received data, and detects the phase difference PDI together. The CP 13 performs adding or subtracting of a current with respect to the loop filter 14 in accordance with the phase difference PDI, and the loop filter 14 generates the control voltage corresponding to the phase difference PDI. In other words, the CP 13 and the loop filter 14 form a control portion of the VCO 11. In the VCO 11, an oscillation frequency is changed depending on the control voltage.

By the above configuration, a feedback circuit that changes the oscillation frequency (frequency of the clock CLK-I) of the VCO 11 is formed. By the feedback circuit, the input data Din and the clock CLK-I are controlled such that the frequency of the input data Din and the frequency of the clock CLK-I are matched, and the change edge (falling edge) of the clock CLK-I matches the change edge of the input data Din, that is, the phases thereof are matched.

In a state where the frequencies and the phases of the input data Din and the clock CLK-I are matched, a rising edge of the clock CLK-I matches a phase in which the input data Din is in the middle of the change edge, that is, a state where the input data Din is stable. Therefore, the input data Din is incorporated in synchronization with the rising edge of the clock CLK-I, and the output data Dout is output as correct received data.

As illustrated in FIG. 1B, even in the state where the frequencies and the phases of the input data Din and the clock CLK-I are matched, the input data Din has jitter of which the phase varies with respect to the clock CLK-I by an influence of a signal path of the input data Din. Even in a state where the jitter is present, since the rising edge of the clock CLK-I matches the stable state of the phase in which the input data Din is in the middle of the change edge, it is possible to incorporate the correct received data, and it is possible to output the received data of which the phase is stable.

Figure 2A:
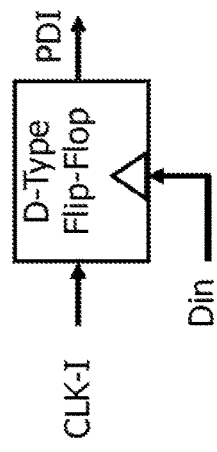
FIG. 2A illustrates a circuit example of the phase detection circuit.
Figure 2B:
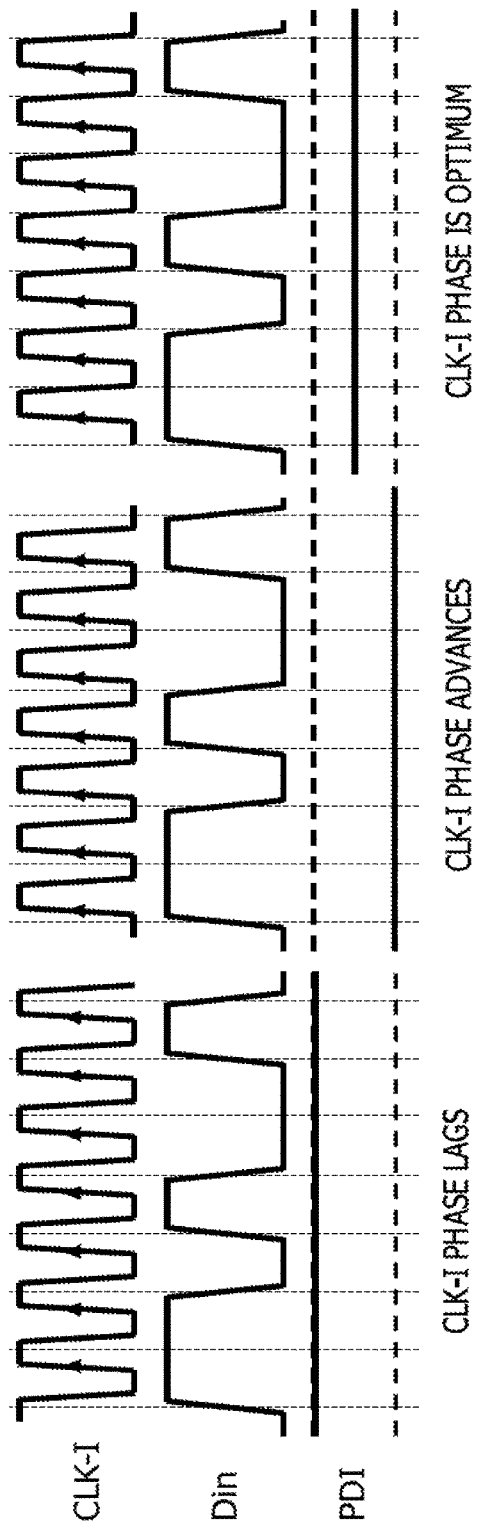
FIG. 2B illustrates time charts of operation in the CDR circuit.

FIG. 2A and FIG. 2B are time charts illustrating a circuit example of the phase detection circuit (PD), and operation in the CDR circuit, FIG. 2A illustrates a circuit example of the PD, and FIG. 2B illustrates a time chart.

As illustrated in FIG. 2A, the phase detection circuit (PD) is formed by a D typed (D-type) flip flop (FF). Here, the input data Din is input to a clock terminal of the D-type FF, and the clock CLK-I is input to a data terminal of the D-type FF. The D-type FF latches a value of the clock CLK-I when the input data Din is changed, thereby, outputs the value as a phase difference PDI. Here, an example in which the input data Din is input to the clock terminal of the D-type FF, and the clock CLK-I is input to the data terminal of the D-type FF is illustrated, but it is possible to make a configuration in which the clock CLK-I is input to the clock terminal of the D-type FF, and the input data Din is input to the data terminal of the D-type FF. Furthermore, the input data Din and the clock CLK-I are illustrated as a single phase signal, but it is desirable that a high-speed signal of several GHz or higher is realized by a differential circuit. Therefore, the D-type FF of FIG. 2A latches the clock CLK-I not only at the rising edge of the input data Din but also at the falling edge, and this is applied to the following description and other signals in the same manner. However, the embodiments are not limited thereto, and it is possible to operate even with the single phase signal. In the case of a differential signal, it is made such that the inverted input data Din and the inverted clock CLK-I are input by using two latch circuits, thereby, the change is detected at both of the rising edge and the falling edge.

In the time chart of FIG. 2B, respectively, a case where the phase of the clock CLK-I lags with respect to the phase of the input data Din is illustrated on a left side, a case where the CLK-I phase advances thereto is illustrated in a central portion, and a case where the CLK-I phase is optimum (phases are matched) is illustrated on a right side.

In a case where the phase of the clock CLK-I lags with respect to the input data Din, at the change edge of the input data Din, the clock CLK-I is at a high (H) level, and the phase difference PDI is at the H level. In response thereto, the VCO 11 is controlled in a direction of increasing the oscillation frequency.

In a case where the phase of the clock CLK-I advances with respect to the input data Din, at the change edge of the input data Din, the clock CLK-I is at a low (L) level, and the phase difference PDI is at the L level. In response thereto, the VCO 11 is controlled in a direction of decreasing the oscillation frequency.

In a case where the phase of the clock CLK-I is optimum with respect to the input data Din, at the change edge of the input data Din, the clock CLK-I is determined to be L or H, but the VCO 11 is controlled so as to be reversely determined thereafter. Since such a control is repeated, probabilities of being determined as L or H become equal. Thereby, the PDI is changed between L and H, and the control voltage which the loop filter 14 outputs is at an intermediate level between L and H. In FIG. 2A, for convenience of the description, the PDI is not a waveform which is alternately changed to alternately be L or H, and is indicated by the intermediate level which is averaged by the loop filter 14.

The CDR circuit illustrated in FIG. 1A has a problem that a frequency range in which clock recovery is possible is narrow. Therefore, used is the CDR circuit using a phase frequency detection circuit (phase frequency detector: PFD) that detects a frequency relationship between the input data and the clock in addition to the phase difference between the input data and the clock.

Figure 3A:
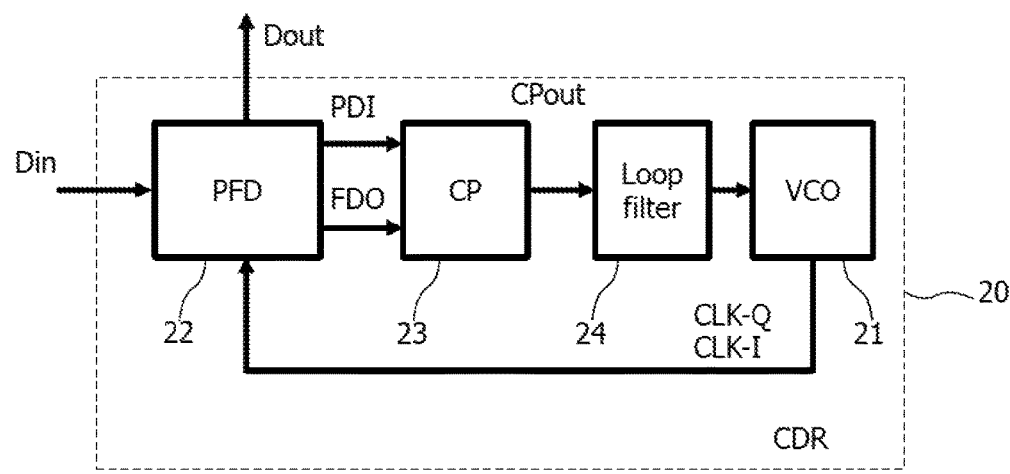
FIG. 3A is a block diagram illustrating a CDR circuit using a PFD.
Figure 3B:
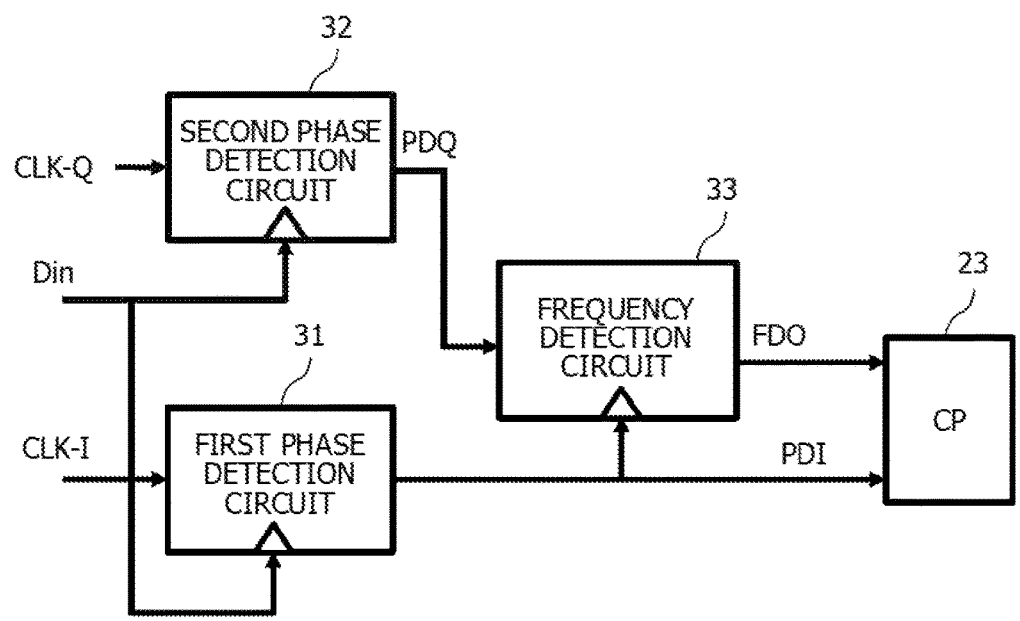
FIG. 3B is a block diagram illustrating a configuration of a PFD.

FIG. 3A and FIG. 3B are diagrams illustrating the CDR circuit using the PFD, FIG. 3A is a block diagram, and FIG. 3B is a block diagram illustrating a configuration of the PFD.

As illustrated in FIG. 3A and FIG. 3B, a CDR circuit 20 includes a VCO 21, a phase frequency detection circuit (PFD) 22, a CP 23, and a loop filter 24. The VCO 21 outputs a second clock CLK-Q of which the frequency is the same as that of the first clock CLK-I, and the phase is different from that of the first clock CLK-I, in addition to a first clock CLK-I. For example, the phase of the second clock CLK-Q advances by 90 degrees with respect to the first clock CLK-I. The PFD 22 detects the phase difference PDI between the input data Din and the first clock CLK-I, and a frequency detection signal FDO.

As illustrated in FIG. 3B, the PFD 22 includes a first phase detection circuit 31, a second phase detection circuit 32, and a frequency detection circuit 33. A first phase detection circuit of a differential type and a second phase detection circuit of a differential type which are formed by two sample hold circuits (latch circuits), and a multiplexer. Moreover, a frequency detection circuit of a differential type which is formed by two latch circuits, and a modified multiplexer.

The first phase detection circuit 31 synthesizes the value of the first clock CLK-I latched at the change edge of the input data Din, and outputs the synthesized valued as a clock phase control signal PDI. The clock phase control signal PDI indicates whether the change edge of the first clock CLK-I advances or lags with respect to the change edge of the input data Din. The second phase detection circuit 32 synthesizes the value of the second clock CLK-Q latched at the change edge of the input data Din, and outputs the synthesized value as a clock phase detection signal PDQ. The clock phase detection signal PDQ indicates whether the change edge of the second clock CLK-Q advances or lags with respect to the change edge of the input data Din.

The frequency detection circuit 33 generates the frequency detection signal FDO indicating whether the frequency of the first clock CLK-I is small or large with respect to the frequency of the input data Din, from the direction of the change edge of the PDI, and the value of the PDQ latched at the change edge of the PDI. The FDO indicates a case where the frequency of the first clock CLK-I is small with respect to the frequency of the input data Din by +1, indicates a case where the frequency of the first clock CLK-I is large with respect to the frequency of the input data Din by −1, and indicates a case where the frequency of the first clock CLK-I is the same as the frequency of the input data Din by 0. The clock phase control signal PDI, and the frequency detection signal FDO are supplied to the charge pump 23. Thereby, the control of the VCO 21 is performed based on the clock phase control signal PDI and the frequency detection signal FDO.

Figure 4A:
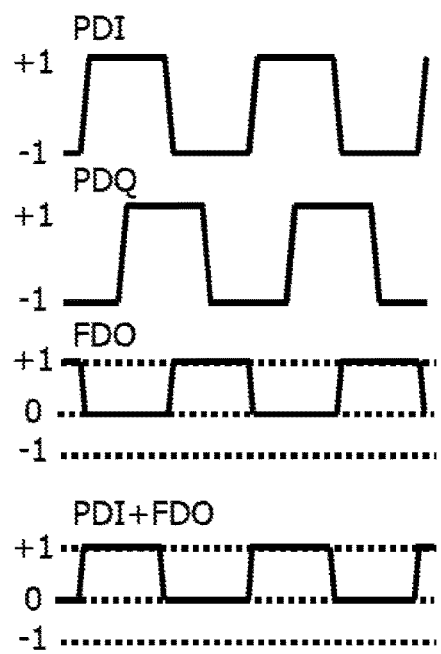
FIG. 4A illustrates waveforms of a state where a frequency of input data is different from a frequency of a first clock.
Figure 4B:
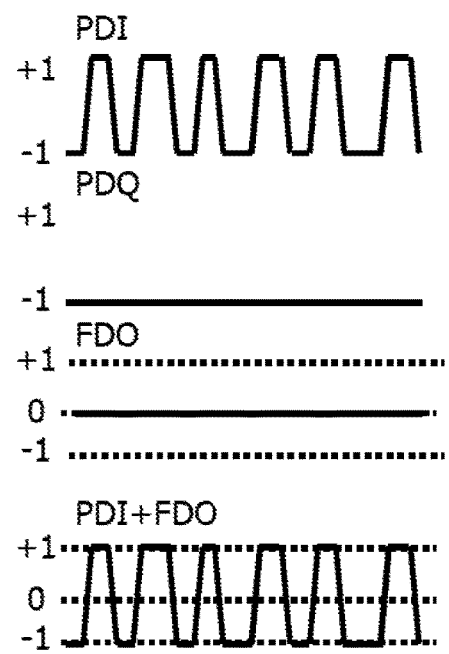
FIG. 4B illustrates waveforms of a normal lock state where frequencies and phases are matched.

FIG. 4A and FIG. 4B are time charts illustrating operation of each portion in the PFD of FIG. 3B, FIG. 4A illustrates waveforms of a non-lock state (unlock state) where the frequency of the input data Din is different from the frequency of the first clock CLK-I, and FIG. 4B illustrates waveforms of a lock state where the frequencies and the phases are matched.

As illustrated in FIG. 4A, in the non-lock state where the frequency of the input data Din is different from the frequency of the first clock CLK-I, both of the clock phase control signal PDI and the clock phase detection signal PDQ are changed, and the frequency detection signal FDO is also changed. FIG. 4A illustrates a state where the frequency of the first clock CLK-I is smaller than that of the input data Din, and the FDO is changed to be a reverse phase to the PDI between 0 and +1, as illustrated in FIG. 4A. At the time of a state where the frequency of the first clock CLK-I is larger than that of the input data Din, the FDO is changed between 0 and −1. In a case where PDI+FDO obtained by synthesizing the PDI and the FDO at a ratio of 1:1 with the charge pump 23 and the loop filter 24 is generated as a control signal, PDI+FDO is changed between 0 and +1, and the oscillation frequency of the VCO 21 is increased. The control signal is not limited to PDI+FDO, and there may be a case to make weighting of the synthesis different.

As illustrated in FIG. 4B, in a state where the input data Din and the first clock CLK-I are matched in frequency and phase, the clock phase control signal PDI is changed, but the clock phase detection signal PDQ is fixed at a predetermined value (−1). Therefore, the frequency detection signal FDO becomes zero. Accordingly, PDI+FDO becomes PDI, and the control of the VCO 21 is performed by using only the clock phase control signal PDI, without using the frequency detection signal FDO.

In the CDR circuit, reduction in power consumption is demanded. As described above, the frequency detection signal becomes zero in the lock state, and the circuit that detects the frequency detection signal operates even if the control of the VCO is not affected, thereby, the power consumption of the circuit is useless. In the CDR circuit, it is considered that most of portions are in the lock state in actual operation, and if the frequency detection circuit is stopped in the lock state, the power consumption can be reduced.

However, in a case where the frequency detection circuit is stopped, the CDR circuit becomes a CDR circuit using only the phase detection circuit, the frequency range in which the clock recovery is possible is narrow, thereby, it is not possible to detect that the state is changed to the non-lock state from the lock state, and it is not possible to activate the frequency detection circuit again at the time of the non-lock state.

Heretofore, it is not performed to detect whether the state is the lock state or the non-lock state from a comparison result of the input data and the output data.

In a signal recovery circuit according to the embodiments described below, the state is detected to be changed to the non-lock state from the lock state, regardless of the phase frequency detection circuit.

Figure 5A:
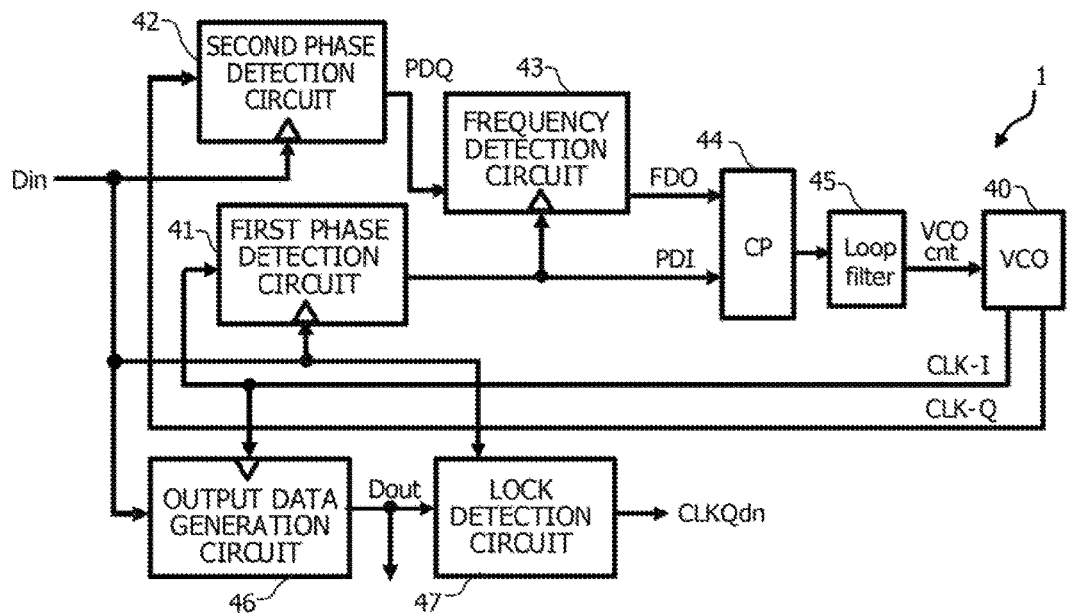
FIG. 5A is a block diagram illustrating a signal recovery circuit according to a first embodiment.
Figure 5B:
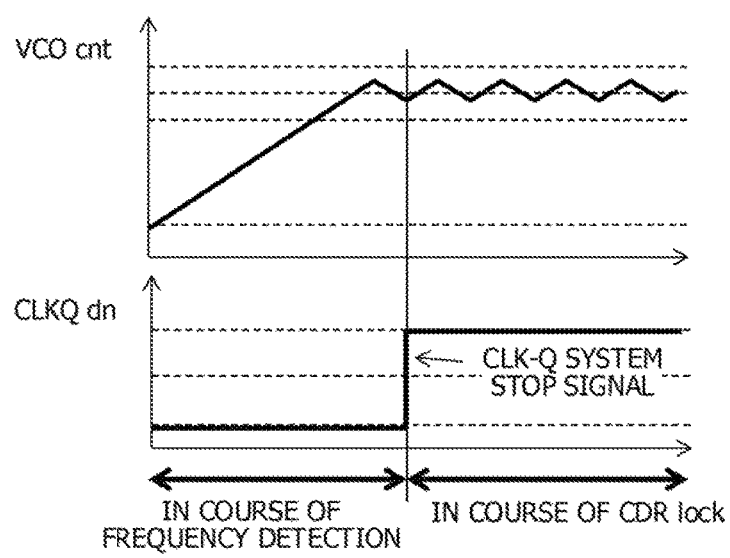
FIG. 5B is a time chart illustrating operation at the time of activation of the CDR circuit illustrated in FIG. 5A.

FIG. 5A and FIG. 5B are diagrams illustrating a signal recovery (clock and data recovery: CDR) circuit according to a first embodiment, FIG. 5A is a block diagram, and FIG. 5B is a time chart illustrating operation at the time of activation of the CDR circuit illustrated in FIG. 5A.

A CDR circuit 1 includes a voltage control oscillator 40, a first phase detection circuit 41, a second phase detection circuit 42, a frequency detection circuit 43, a charge pump 44, a loop filter 45, an output data generation circuit 46, and a lock detection circuit 47. The VCO 40, the first phase detection circuit 41, the second phase detection circuit 42, the frequency detection circuit 43, the CP 44, and the loop filter 45 may use the same as corresponding components illustrated in FIG. 3A and FIG. 3B, but are not limited thereto. The charge pump 44 and the loop filter 45 form a control portion that controls the oscillator depending on the phase relationship between the input data and the first clock.

The VCO 40 generates the second clock CLK-Q of which the frequency is the same as that of the first clock CLK-I, and the phase is different from that of the first clock CLK-I, in addition to the first clock CLK-I. The VCO 40 changes the frequencies of the first clock CLK-I and the second clock CLK-Q by changing the control voltage. The phase of the second clock CLK-Q advances by 90 degrees with respect to the first clock CLK-I.

The first phase detection circuit 41 synthesizes the value of the first clock CLK-I latched at the change edge of the input data Din, and outputs the synthesized valued as a clock phase control signal PDI. The clock phase control signal PDI indicates whether the change edge of the first clock CLK-I advances or lags with respect to the change edge of the input data Din. The second phase detection circuit 42 synthesizes the value of the second clock CLK-Q latched at the change edge of the input data Din, and outputs the synthesized value as a clock phase detection signal PDQ. The clock phase detection signal PDQ indicates whether the change edge of the second clock CLK-Q advances or lags with respect to the change edge of the input data Din. The frequency detection circuit 43 generates the frequency detection signal FDO indicating whether the frequency of the first clock CLK-I is small or large with respect to the frequency of the input data Din, from the direction of the change edge of the PDI, and the value of the PDQ latched at the change edge of the PDI. The FDO indicates a case where the frequency of the first clock CLK-I is small with respect to the frequency of the input data Din by +1, indicates a case where the frequency of the first clock CLK-I is large with respect to the frequency of the input data Din by −1, and indicates a case where the frequency of the first clock CLK-I is the same as the frequency of the input data Din by 0. For example, the first phase detection circuit 41, the second phase detection circuit 42, and the frequency detection circuit 43 are realized by the differential typed circuits.

The CP 44 performs adding or subtracting of the current with respect to the loop filter 45 in accordance with the PDI and the FDO in a frequency difference state, and performs adding or subtracting of the current with respect to the loop filter 45 in accordance with the PDI in the normal lock state and the reverse phase lock state. The loop filter 45 generates the control voltage by the adding or the subtracting of the current, and supplies the control voltage to the VCO 40.

The output data generation circuit 46 is formed by a D typed flip flop, and the input data Din is input to the data terminal, and the first clock CLK-I is input to the clock terminal. The output data generation circuit 46 latches the input data Din at the rising edge of the first clock CLK-I, and outputs the output data Dout. For example, the output data generation circuit 46 is realized by a differential typed circuit.

Based on the comparison result of the input data Din and the output data Dout, the lock detection circuit 47 outputs a lock detection signal CLKQdn indicating whether the state is the lock state or the non-lock state.

By the above configuration, formed is a feedback control system in which the frequency of the first clock CLK-I matches the frequency of the input data Din, and the falling edge of the first clock CLK-I is synchronized with the change edge of the input data Din. That is, the first phase detection circuit 41, the second phase detection circuit 42, the frequency detection circuit 43, the CP 44, the loop filter 45, the output data generation circuit 46, and the lock detection circuit 47 form a feedback circuit that controls the VCO 40. Furthermore, the first phase detection circuit 41, the second phase detection circuit 42, and the frequency detection circuit 43 form a phase frequency detector (PFD) that detects the phase relationship and the frequency relationship between the input data Din and the first clock CLK-I. The output data generation circuit 46, and the lock detection circuit 47 form a state detection circuit that detects whether the CDR circuit is in the lock state or the non-lock state (frequency difference state).

In FIG. 5B, the change of the oscillation frequency (frequency of the first clock CLK-I) of the VCO 40 is illustrated on an upper side, and the change of the lock detection signal CLKQdn is illustrated on a lower side.

If the CDR circuit 1 is activated, the oscillation frequency of the VCO 40 is monotonically increased from a free running frequency by the feedback control. If the lock detection circuit 47 detect that the oscillation frequency of the VCO 40 is increased up to a predetermined range (tracking range of the PDI) before and after a lock frequency being the frequency of the input data Din, the lock detection signal CLKQdn is changed to be 1. A change range of the oscillation frequency of the VCO 40 which is to the tracking range of the PDI from the free running frequency is a frequency pull-in range due to the frequency difference (FD) operation. By using the PFD, it is possible to make the frequency pull-in range large in comparison with a case where the PD is used. In the lock state, the oscillation frequency of the VCO 40 is repeatedly increased and decreased so as to match the lock frequency, by the feedback control.

Figure 6A:
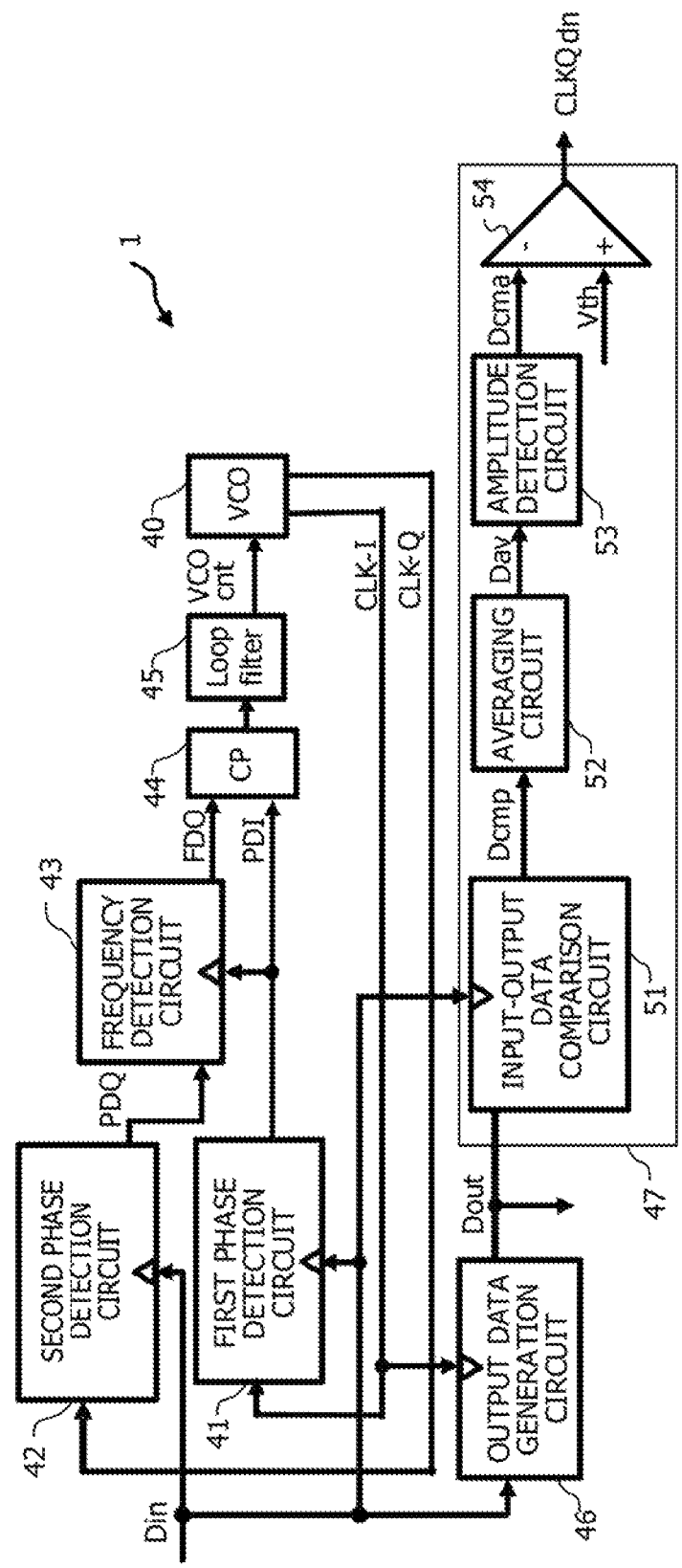
FIG. 6A is a more detailed block diagram of the signal recovery circuit illustrated in FIG. 5A.

FIG. 6A is a block diagram illustrating internal circuits of the lock detection circuit 47 in the CDR circuit 1, FIG. 6B is a time chart illustrating the relationship between the input signal Din and the output signal Dout at the time of the lock state, FIG. 6C is a time chart illustrating a relationship between the input signal Din and the output signal Dout at the time of the non-lock state, and FIG. 6D is a time chart illustrating the operation of the lock detection circuit 47 at the time of activation of the CDR circuit 1.

The lock detection circuit 47 includes an input-output data comparison circuit 51, an averaging circuit 52, an amplitude detection circuit 53, and a determination circuit 54. The input-output data comparison circuit 51 compares the input data Din and the output data Dout, and outputs an input-output data comparison signal Dcmp indicating a comparison result thereof. The averaging circuit 52, the amplitude detection circuit 53, and the determination circuit 54 form a state determination circuit that determines whether the CDR circuit 1 is in the lock state or the non-lock state, based on the input-output data comparison signal Dcmp input from the input-output data comparison circuit 51.

The input-output data comparison circuit 51 is formed by a D typed flip flop, and the input data Din is input to the clock terminal, and the output data Dout is input to the data terminal. The input-output data comparison circuit 51 latches the output data Dout at the rising edge of the input data Din, and outputs the input-output data comparison signal Dcmp. For example, the input-output data comparison circuit 51 is realized by the differential typed circuit. A time difference between the output data Dout input to the data terminal of the input-output data comparison circuit 51 and the input data Din input to the clock terminal of the input-output data comparison circuit 51 is longer than a hold time of the input-output data comparison circuit 51, and is shorter than a period of the first clock CLK-I. The input-output data comparison circuit 51 may have a configuration in which the output data Dout is latched at the rising edge of the input data Din, but the output data Dout is latched at the falling edge of the input data Din. In this case, the output data generation circuit 46 may have a configuration in which the input data Din is latched at the falling edge of the first clock CLK-I.

The averaging circuit 52 output an averaged signal Dav by averaging amplitudes of the input-output data comparison signal Dcmp.

Figure 7:
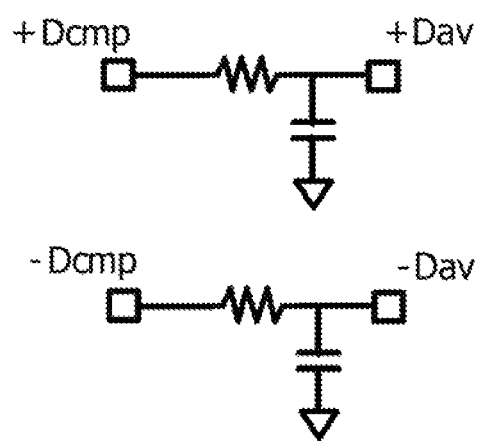
FIG. 7 is a diagram illustrating a configuration example of an averaging circuit illustrated in FIG. 6A.

FIG. 7 is a diagram illustrating a configuration example of the averaging circuit 52. The averaging circuit 52 is a well-known filter circuit that is formed of a resistance element and a capacitance element, and includes two similar circuits of a first filter and a second filter circuit since the input-output data comparison signal Dcmp is a differential signal. If a positive polarity signal +Dcmp is input to the first filter circuit, the first filter circuit outputs a filtered positive polarity signal +Dav. If a negative polarity signal −Dcmp is input to the second filter circuit, the second filter circuit outputs a filtered negative polarity signal −Dav.

The amplitude detection circuit 53 detects the amplitude of the averaged signal Dav, and outputs an amplitude signal Dcma indicating the amplitude of the averaged signal Dav.

Figure 8:
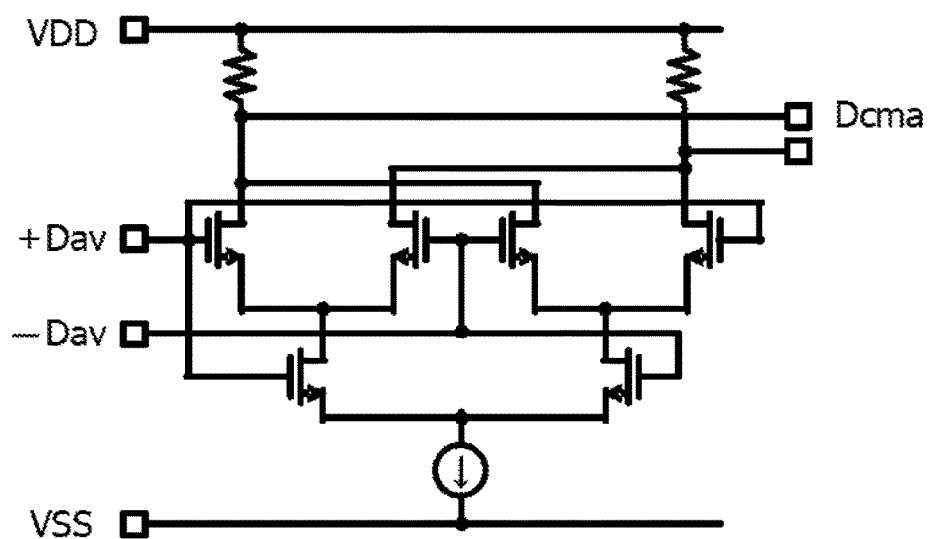
FIG. 8 is a diagram illustrating a configuration example of an amplitude detection circuit illustrated in FIG. 6A.

FIG. 8 is a diagram illustrating a configuration example of the amplitude detection circuit 53. The amplitude detection circuit 53 is a well-known arithmetic circuit that performs multiplication (square operation) of +Dav and −Dav of the differential inputs. +Dav and −Dav of the differential inputs indicate +1 or −1 when the amplitude is large, and indicate 0 when the amplitude is small. Therefore, at the time of +1 or −1 in a case where the amplitude is large, a case of the amplitude signal Dcma=1 is made, and at the time of 0 in a case where the amplitude is small, a case of the amplitude signal Dcma=0 is made.

The determination circuit 54 compares the amplitude signal Dcma which the amplitude detection circuit 53 outputs with a threshold Vth, and outputs the lock detection signal CLKQdn. The lock detection signal CLKQdn becomes 0 when a signal value corresponding to the amplitude signal Dcma is larger than the threshold Vth, and becomes 1 when the signal value corresponding to the amplitude signal Dcma is smaller than the threshold Vth.

As illustrated in FIG. 6B, when the CDR circuit 1 is in the lock state, since the output data generation circuit 46 outputs the output data Dout by latching the input data Din, the output data Dout is changed in accordance with the input data Din, by being delayed as a given delayed amount Td. Since the input-output data comparison circuit 51 latches the output data Dout at the rising edge of the input data Din, when the CDR circuit 1 is in the lock state, a case of the input-output data comparison signal Dcmp=0 is made.

On the other hand, as illustrated in FIG. 6C, when the CDR circuit 1 is in the non-lock state, the output data generation circuit 46 may not latch the input data Din due to data jump, timing deviation or the like. When the output data generation circuit 46 may not latch the input data Din, the output data Dout is not changed in accordance with the input data Din, as illustrated by a period A. When the output data Dout is not changed in accordance with the input data Din, a case of the input-output data comparison signal Dcmp=1 is made, and the input-output data comparison signal Dcmp includes an error pulse.

When the CDR circuit 1 is in the non-lock state, since the input-output data comparison signal Dcmp includes a lot of error pulses, the amplitude signal Dcma indicating the amplitude of the averaged signal Dav obtained by averaging the input-output data comparison signals Dcmp is larger than the threshold Vth. When the CDR circuit 1 is in the non-lock state, since the amplitude signal Dcma is larger than the threshold Vth, a case of the lock detection signal CLKQdn=0 is made. On the other hand, when the CDR circuit 1 is in the lock state, since the input-output data comparison signal Dcmp does not include substantially the error pulse, the amplitude signal Dcma is smaller than the threshold Vth, and a case of the lock detection signal CLKQdn=1 is made. In response to a case where the CDR circuit 1 is in the lock state, and the input-output data comparison signal Dcmp is smaller than the threshold Vth, the determination circuit 54 performs transition of the lock detection signal CLKQdn which is from 0 to 1.

In the CDR circuit 1, the state detection circuit including the output data generation circuit 46 and the lock detection circuit 47 detects whether the CDR circuit is in the lock state or the non-lock state (state which is in the frequency pull-in range). The state detection circuit is also effective in a case where the second phase detection circuit 42, and the frequency detection circuit 43 are not present, and the state detection circuit can detect whether the state is the lock state or the non-lock state, based on the clock phase control signal PDI which the first phase detection circuit 41 outputs.

Figure 9A:
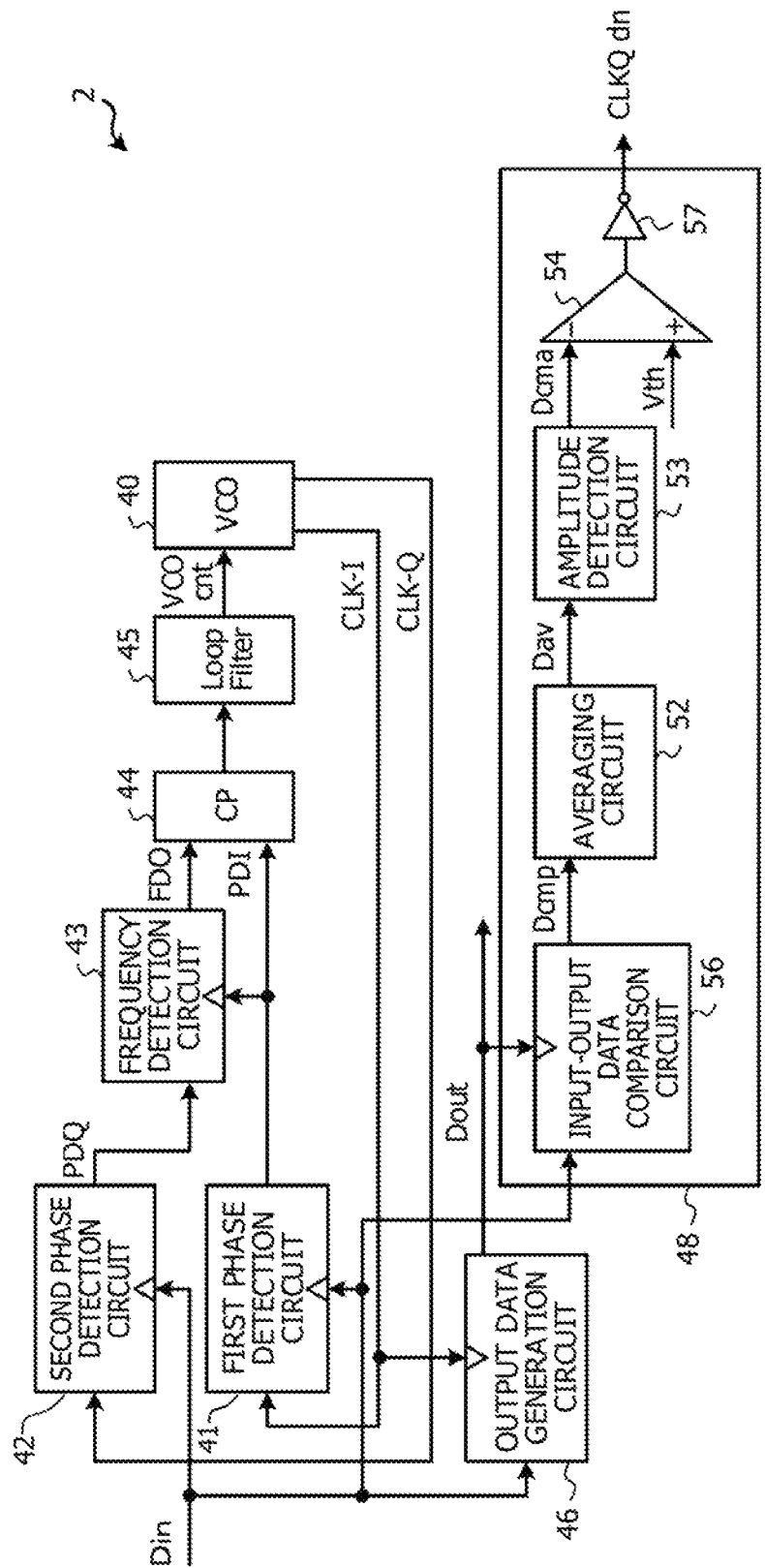
FIG. 9A is a block diagram illustrating a signal recovery circuit according to a second embodiment.
Figure 9B:
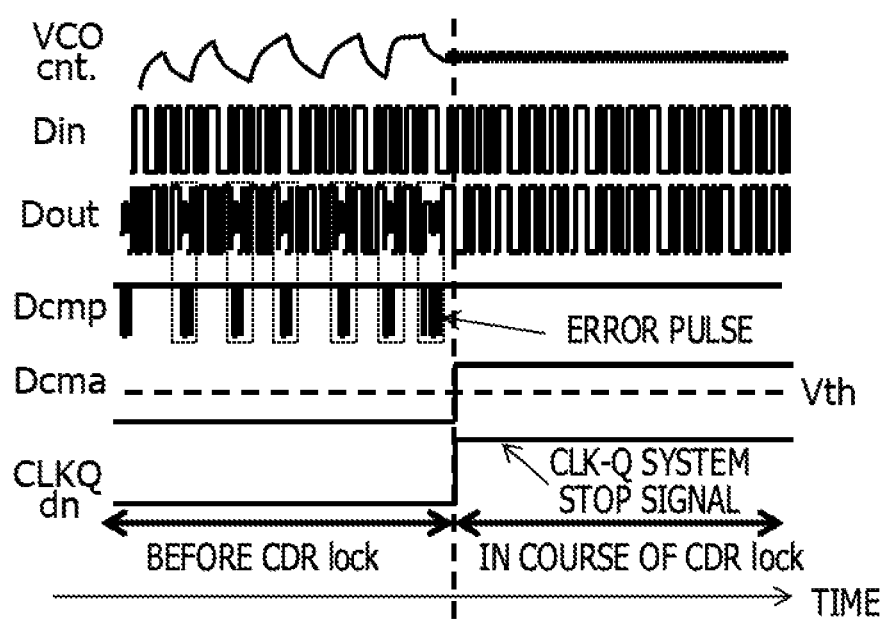
FIG. 9B is a time chart illustrating operation at the time of activation of the CDR circuit illustrated in FIG. 9A.

FIG. 9A and FIG. 9B are diagrams illustrating a CDR circuit according to a second embodiment, FIG. 9A is a block diagram, and FIG. 9B is a time chart illustrating operation at the time of activation of the CDR circuit.

A CDR circuit 2 is different from the CDR circuit 1 in a point that a lock detection circuit 48 is disposed in place of the lock detection circuit 47. The lock detection circuit 48 is different from the lock detection circuit 47 in a point that an input-output data comparison circuit 56 is disposed in place of the input-output data comparison circuit 51. The lock detection circuit 48 is further different from the lock detection circuit 47 in a point that a detection inverter 57 is disposed. Since the configurations and the functions of the components of the CDR circuit 2 other than the input-output data comparison circuit 56, and the detection inverter 57 are the same as those of the components of the CDR circuit 1 to which the same signs are attached, here, the detailed description thereof will be omitted.

The input-output data comparison circuit 56 is formed by a D typed flip flop. A connection relationship between the input data Din and the output data Dout is opposite to a connection relationship of the input-output data comparison circuit 51. That is, in the input-output data comparison circuit 56, the input data Din is input to the data terminal, and the output data Dout is input to the clock terminal. The input-output data comparison circuit 56 latches the input data Din at the rising edge of the output data Dout, and outputs the input-output data comparison signal Dcmp. For example, the input-output data comparison circuit 56 is realized by the differential typed circuit. A time difference between the input data Din input to the data terminal of the input-output data comparison circuit 51 and the output data Dout input to the clock terminal of the input-output data comparison circuit 51 is longer than a hold time of the input-output data comparison circuit 56, and is shorter than one period of the first clock CLK-I.

When the CDR circuit 2 is in the lock state, since the output data generation circuit 46 outputs the output data Dout by latching the input data Din, the output data Dout is changed in accordance with the input data Din, by being delayed as a given delayed amount Td. Since the input-output data comparison circuit 56 latches the input data Din at the rising edge of the output data Dout, when the CDR circuit 2 is in the lock state, a case of the input-output data comparison signal Dcmp=1 is made.

On the other hand, when the CDR circuit 2 is in the non-lock state, the output data generation circuit 46 may not latch the output data Dout due to the data jump, the timing deviation or the like. When the output data generation circuit 46 may not latch the output data Dout, the output data Dout is not changed in accordance with the input data Din. When the output data Dout is not changed in accordance with the input data Din, a case of the input-output data comparison signal Dcmp=0 is made, and the input-output data comparison signal Dcmp includes the error pulse.

The detection inverter 57 inverts the signal output from the determination circuit 54, and outputs the lock detection signal CLKQdn.

When the CDR circuit 2 is in the non-lock state, since the input-output data comparison signal Dcmp includes a lot of error pulses, the amplitude signal Dcma indicating the amplitude of the averaged signal Dav obtained by averaging the input-output data comparison signals Dcmp is smaller than the threshold Vth. When the CDR circuit 2 is in the non-lock state, since the amplitude signal Dcma is smaller than the threshold Vth, the output signal of the determination circuit 54 becomes 1, and a case of the lock detection signal CLKQdn=0 is made. On the other hand, when the CDR circuit 2 is in the lock state, since the input-output data comparison signal Dcmp does not include substantially the error pulse, the amplitude signal Dcma is larger than the threshold Vth, the output signal of the determination circuit 54 becomes 0, and a case of the lock detection signal CLKQdn=1 is made. In response to a case where the CDR circuit 2 is in the lock state, and the input-output data comparison signal Dcmp is larger than the threshold Vth, thereby, the determination circuit 54 performs the transition of the output signal which is from 1 to 0, the detection inverter 57 performs the transition of the lock detection signal CLKQdn which is from 0 to 1.

Figure 10:
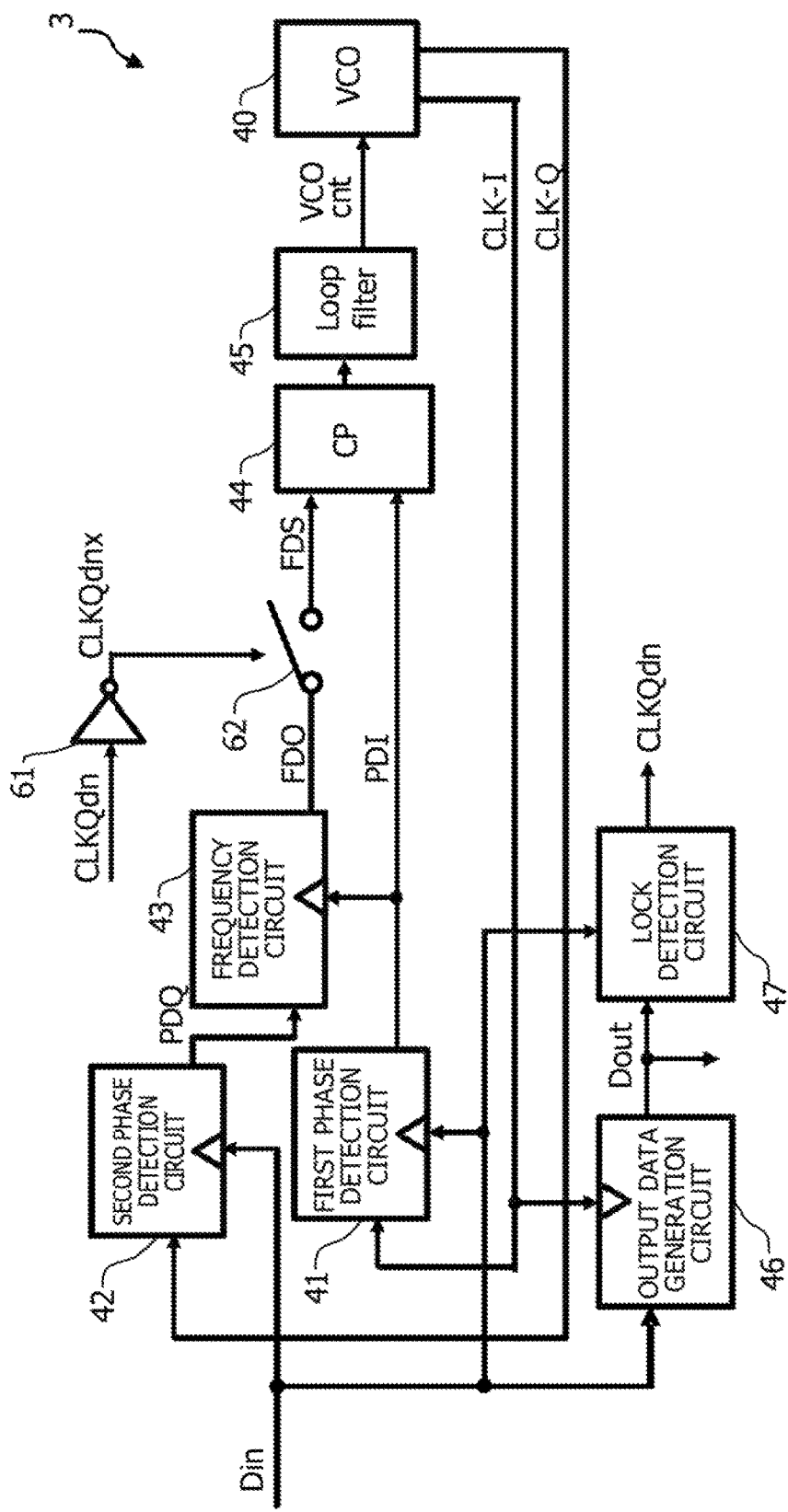
FIG. 10 is a block diagram of a CDR circuit according to a third embodiment.

FIG. 10 is a block diagram of a CDR circuit according to a third embodiment.

A CDR circuit 3 is different from the CDR circuit 1 in a point that a switch input inverter 61, and a switch 62 are disposed. Since the configurations and the functions of the components of the CDR circuit 3 other than the switch input inverter 61, and the switch 62 are the same as those of the components of the CDR circuit 1 to which the same signs are attached, here, the detailed description thereof will be omitted.

The switch input inverter 61 inverts the lock detection signal CLKQdn output from the determination circuit 54, and outputs a lock detection inverse signal CLKQdnx.

The switch 62 switches whether or not to supply the frequency detection signal FDO which the frequency detection circuit 43 outputs to the CP 44, depending on the lock detection inverse signal CLKQdnx. Specifically, the switch 62 switches to supply the FDO to the CP 44 in the non-lock state (state which is in the frequency pull-in range), that is, the frequency difference (FD) state, and not to supply the FDO to the CP 44 in the lock state. Here, a signal supplied to the CP 44 from the switch 62 is expressed by FDS. The signal FDS input to the CP 44 is the FDO in the frequency difference state, and a fixed value (for example, 0) which has no influence on the CP 44 in the lock state.

The CP 44 performs adding or subtracting of the current with respect to the loop filter 45 in accordance with the PDI and the FDS in the frequency difference state, and performs adding or subtracting of the current with respect to the loop filter 45 in accordance with the PDI in the lock state. The loop filter 45 generates the control voltage by the adding or the subtracting of the current, and supplies the control voltage to the VCO 40.

Even in the lock state, when the signal of which the jitter is large is received, the frequency detection signal may vary, the frequency detection circuit 43 may operate, and may be caused to output the frequency detection signal indicating that the input data and the first clock are not matched in frequency. If such a frequency detection signal is input to the charge pump 44, the control of the VCO is temporarily changed, and an out-of-synchronization (non-lock) error indicating that the frequency of the first clock is different from the frequency of the input data is generated. However, in the CDR circuit 3, even if the frequency detection circuit 43 generates the frequency detection signal FDO indicating that the frequencies are not matched by receiving the signal of which the jitter is large, the frequency detection FDO is not immediately input to the charge pump 44, and the out-of-synchronization error is not generated. On the other hand, when the non-lock state is made, the lock detection signal CLKQdn is changed to be a value indicating the non-lock state, and the frequency detection signal is input to the charge pump 44 by making the switch 62 conductive, and the wide frequency pull-in range is realized.

Figure 11A:
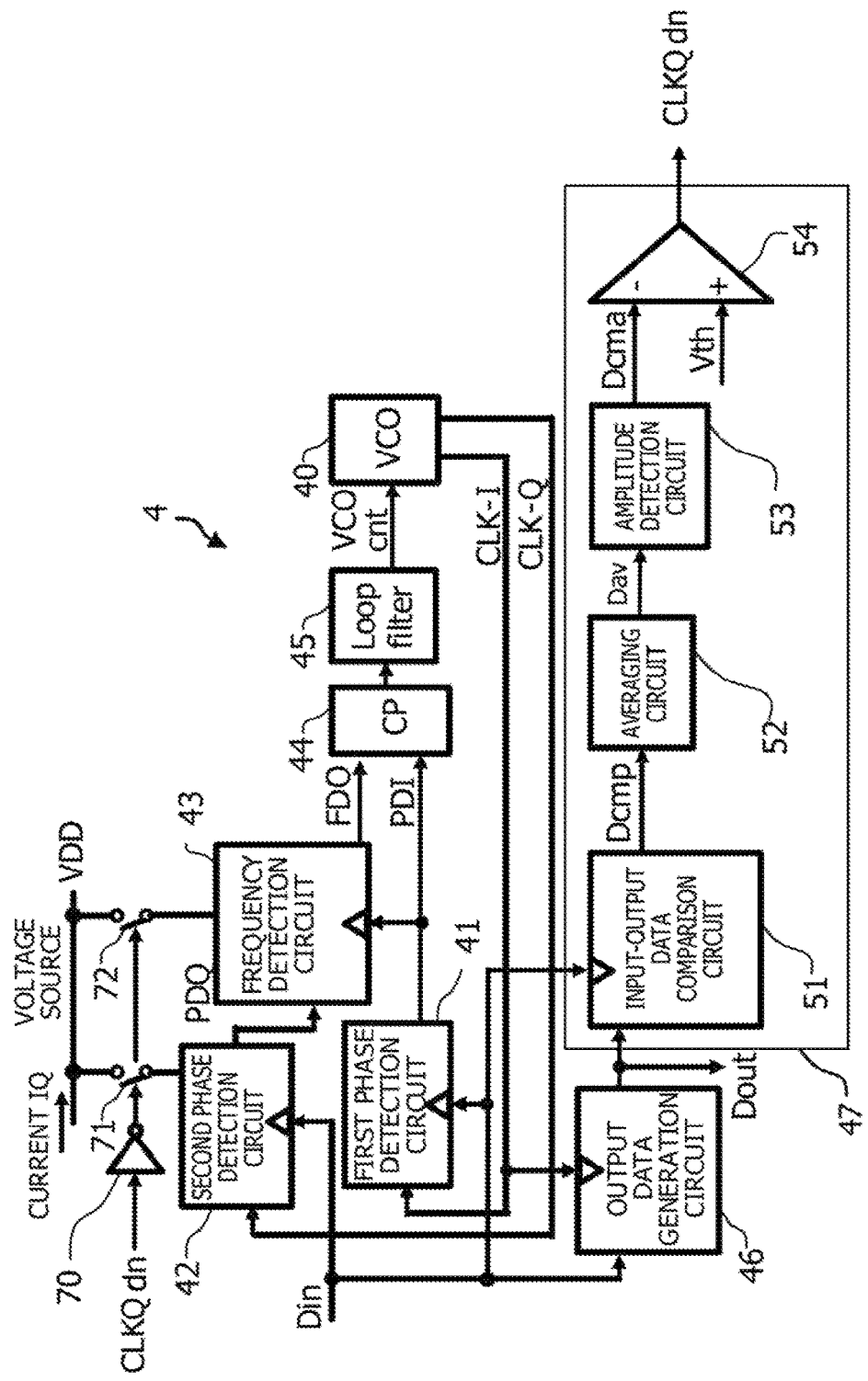
FIG. 11A is a block diagram illustrating a CDR circuit according to a fourth embodiment.
Figure 11B:
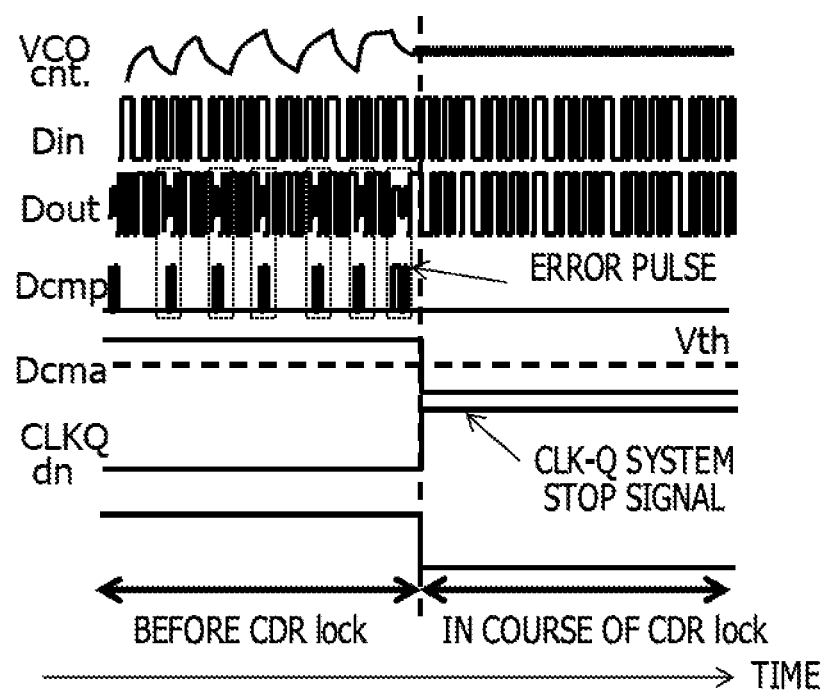
FIG. 11B is a time chart illustrating operation at the time of activation of the CDR circuit illustrated in FIG. 11A.

FIG. 11A and FIG. 11B are diagrams illustrating a CDR circuit according to a fourth embodiment, FIG. 11A is a block diagram, and FIG. 11B is a time chart illustrating operation at the time of activation of the CDR circuit.

A CDR circuit 4 is different from the CDR circuit 1 in a point that a switch input inverter 70, a first switch 71, and a second switch 72 are disposed. Since the configurations and the functions of the components of the CDR circuit 4 other than the switch input inverter 70, the first switch 71, and the second switch 72 are the same as those of the components of the CDR circuit 1 to which the same signs are attached, here, the detailed description thereof will be omitted.

The switch input inverter 70 inverts the lock detection signal CLKQdn output from the determination circuit 54, and outputs the lock detection inverse signal CLKQdnx.

The first switch 71 is disposed between a voltage source that supplies a power supply voltage VDD and the second phase detection circuit 42, and switches whether or not to supply the power supply voltage VDD to the second phase detection circuit 42 depending on the lock detection inverse signal CLKQdnx. Specifically, the first switch 71 switches to supply the power supply voltage VDD to the second phase detection circuit 42 in the non-lock state, and not to supply the power supply voltage VDD to the second phase detection circuit 42 in the lock state.

The second switch 72 is disposed between the voltage source that supplies a power supply voltage VDD and the frequency detection circuit 43, and switches whether or not to supply the power supply voltage VDD to the frequency detection circuit 43 depending on the lock detection inverse signal CLKQdnx. Specifically, the second switch 72 switches to supply the power supply voltage VDD to the frequency detection circuit 43 in the non-lock state, and not to supply the power supply voltage VDD to the frequency detection circuit 43 in the lock state.

The CDR circuit 4 is different from the CDR circuit 1 in a point that the second phase detection circuit 42 and the frequency detection circuit 43 are caused to be in an OFF state depending on the lock detection signal CLKQdn, and other points are the same. When the lock detection signal CLKQdn indicates the non-lock state, the second phase detection circuit 42 and the frequency detection circuit 43 are in an operation state, and when the lock detection signal CLKQdn indicates the lock state, the second phase detection circuit 42 and the frequency detection circuit 43 are in a non-operation state.

The CDR circuit 4 has the same effect as that of the CDR circuit 1 such that the out-of-synchronization error is not generated by receiving the signal of which the jitter is large, and it is possible to reduce the power consumption since the second phase detection circuit 42 and the frequency detection circuit 43 are stopped at the time of the lock state. In the CDR circuit 4, the second phase detection circuit 42 and the frequency detection circuit 43 operate until the lock state is made, thereby, the wide frequency pull-in range is realized. However, if the lock stated is made once, the frequency detection signal FDO is in a state of being not used. Therefore, there is no problem in particular even if the frequency detection signal FDO is not generated by the second phase detection circuit 42 and the frequency detection circuit 43. In the actual operation of the CDR circuit, the lock state occupies a large proportion thereof, and the operations of the second phase detection circuit 42 and the frequency detection circuit 43 are stopped in the lock state, thereby, the large reduction effect in power consumption is obtained.

In the CDR circuit 4, when the state is changed to the non-lock state from the lock state, the lock detection signal CLKQdn is changed to be the value indicating the non-lock state. In response thereto, the second phase detection circuit 42 and the frequency detection circuit 43 are caused to be in the operation state. Thereby, in the CDR circuit 4, since the frequency detection signal is input to the charge pump 44, the wide frequency pull-in range is realized.

In the CDR circuit 1 to the CDR circuit 4, the configuration in which the frequency detection signal FDO is generated by using the clock phase control signal PDI and the clock phase detection signal PDQ is illustrated. However, the configuration of the CDR circuit is not limited to that of the CDR circuit 1 to the CDR circuit 4, as long as the CDR circuit is a CDR circuit which operates only with the clock phase control signal PDI in the lock state, and causes a circuit for the frequency synchronization to operate in the non-lock state. In the CDR circuits of other configurations according to the embodiment, it is possible to realize the wide frequency pull-in range, and the operation with the phase control signal PDI in the lock state. One example of the CDR circuit which operates only with the clock phase control signal PDI is the CDR circuits with a charge pump circuit 44 that the charge current increases during the non-lock state to realize the wide frequency pull-in range, the charge current decreases during the lock state to realize low power.

Figure 12:
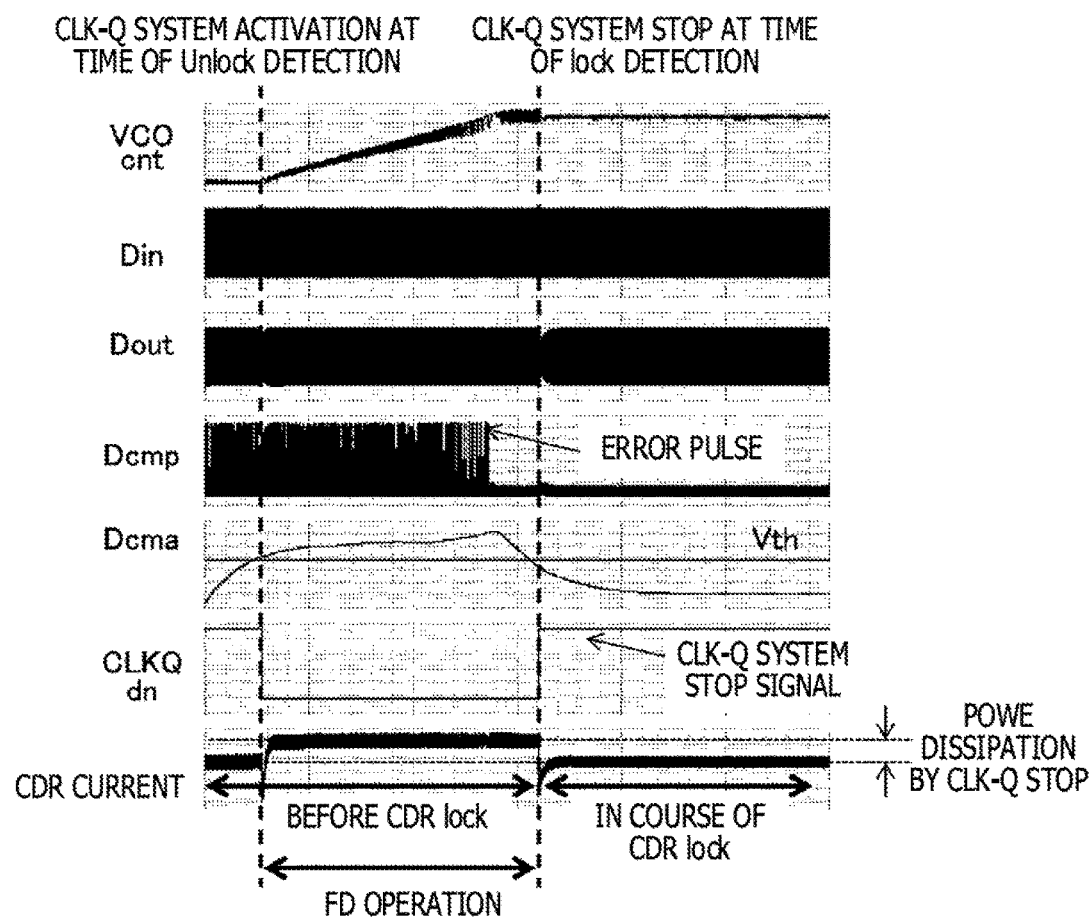
FIG. 12 is a time chart illustrating operation simulation of the CDR circuit illustrated in FIG. 11A.

FIG. 12 is a time chart illustrating operation simulation of the CDR circuit 4.

If a case of the lock detection signal CLKQdn=0 is made, the non-lock state is detected, and the power supply voltage VDD is supplied to the second phase detection circuit 42 and the frequency detection circuit 43, the CDR circuit 4 starts frequency difference (FD) operation. If the lock detection circuit 47 detects that the frequency of the first clock CLK-I is increased up to the tracking range of the PDI, thereby, a case of the lock detection signal CLKQdn=1 is made, the supply of the power supply voltage VDD to the second phase detection circuit 42 and the frequency detection circuit 43 is stopped. By stopping the supply of the power supply voltage VDD to the second phase detection circuit 42 and the frequency detection circuit 43, the power consumption in the lock state is reduced in the CDR circuit 4.

Figure 13:
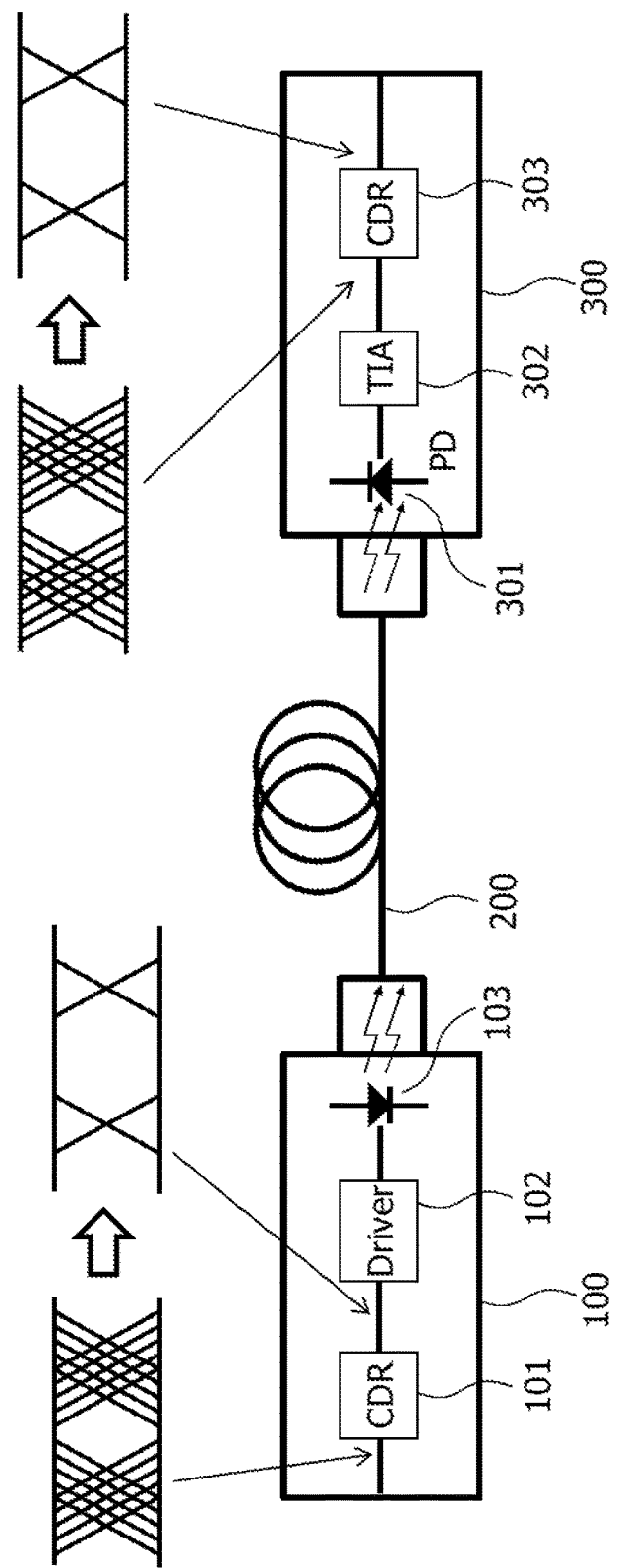
FIG. 13 is a diagram illustrating a configuration of an optical communication system using the CDR circuit according to the embodiments.

FIG. 13 is a diagram illustrating a configuration of an optical communication system using the CDR circuit according to the embodiments.

The optical communication system includes a transmitter 100 that converts a transmitted signal into an optical signal, and outputs the optical signal, an optical fiber 200 that transmits an optical signal from the transmitter 100, a receiver 300 that receives the optical signal, and recovers the received optical signal. The transmitter 100 generates the optical signal by recovering the transmitted signal which is transmitted from an electronic device or the like. Moreover, the transmitter 100 may be a relay device that converts the optical signal received through the optical fiber into an electrical signal once, and thereafter, outputs the optical signal by converting the electrical signal into the optical signal again. The receiver 300 outputs the received signal which is recovered o the electronic device or the like as an electrical signal. Additionally, the receiver 300 may be a relay device that outputs the optical signal by converting the received signal into the optical signal again.

The transmitter 100 includes a signal recovery (CDR) circuit 101, a driver 102, and a laser diode (LD) 103. The signal recovery (CDR) circuit 101 recovers the clock from the received data signal, and recovers the transmitted data signal together. The driver 102 drives the LD 103 depending on the transmitted data signal, and outputs the optical signal to the optical fiber 200 by generating the optical signal.

The receiver 300 includes a photodiode (PD) 301, a trans impedance amplifier (TIA) 302, and a signal recovery (CDR) circuit 303. The PD 301 converts the optical signal received from the optical fiber 200 into the electrical received data signal. The TIA 302 amplifies the received data signal. The CDR circuit 303 recovers the clock from the received data signal, and recovers the received data signal together.

The signal recovery (CDR) circuit according to the embodiments is used as signal recovery (CDR) circuits 101 and 303 in FIG. 12.

Not only the signal recovery (CDR) circuit according to the embodiments may be used in the optical communication system, but also the CDR circuit according to the embodiments may be applied to any circuit in a case where the clock is recovered from the data signal, by a circuit that performs transmission and reception of the data signal which is modulated in synchronization with the clock, inside and outside the electronic device. For example, the CDR circuit according to the embodiments may be used in the field where a bit rate is desired to be further heightened such as a field of high-speed I/O that transmits and receives a signal in an integrated circuit chip or between chips (in a device or between devices).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal recovery circuit comprising:
   an oscillator that generates a first clock of which a frequency is variable; and
   a feedback circuit that controls the oscillator to synchronize the first clock with input data, depending on a phase relationship between the input data and the first clock, the feedback circuit includes
   an oscillator control circuit that controls the oscillator depending on the phase relationship between the input data and the first clock, a first phase detection circuit that generates a clock phase control signal depending on the phase relationship between the input data and the first clock,
an output data generation circuit that generates output data by latching the input data at a change edge of the first clock, and
a lock detection circuit that detects whether the signal recovery circuit is in a lock state or a non-lock state, based on a comparison result of the input data and the output data,
the lock detection circuit includes
an input-output data comparison circuit that latches the output data at a change edge of the input data and outputs an input-output data comparison signal,
an averaging circuit that outputs an averaged signal by averaging an amplitude of the input-output data comparison signal,
an amplitude detection circuit that outputs an amplitude signal indicating an amplitude of the averaged signal, by detecting the amplitude of the averaged signal, and
a determination circuit that determines whether a state is the lock state or the non-lock state, based on a comparison result of an amplitude value corresponding to the amplitude signal and a predetermined threshold.

2. A signal recovery circuit comprising:
an oscillator that generates a first clock of which a frequency is variable and a second clock of which a frequency is the same as that of the first clock, and a phase of the second clock is different from that of the first clock; and
a feedback circuit that controls the oscillator to synchronize the first clock with input data, depending on a phase relationship between the input data and the first clock,
the feedback circuit including
a first phase detection circuit that generates a clock phase control signal depending on the phase relationship between the input data and the first clock,
a second phase detection circuit that generates a clock phase detection signal depending on a phase relationship between the input data and the second clock,
a frequency detection circuit that compares the clock phase control signal and the clock phase detection signal, and generates a frequency detection signal indicating a frequency relationship between the input data and the first clock,
an output data generation circuit that generates output data by latching the input data at a change edge of the first clock,
a lock detection circuit that detects whether the signal recovery circuit is in a lock state or a non-lock state, based on a comparison result of the input data and the output data, and
an oscillator control circuit that controls the oscillator depending on the clock phase control signal and the frequency detection signal.

3. The signal recovery circuit according to claim 2, further comprising a switch that switches to supply the frequency detection signal to the oscillator control circuit at the time of the non-lock state and not to supply the frequency detection signal to the oscillator control circuit at the time of the lock state.

4. The signal recovery circuit according to claim 3, wherein
the feedback circuit causes the second phase detection circuit and the frequency detection circuit to be in a non-operation state at the time of the lock state, and the second phase detection circuit and the frequency detection circuit to be in an operation state at the time of the non-lock state.

5. An electronic device comprising:
a signal recovery circuit that recovers a clock from received input data, and incorporates the input data by the recovered clock, the signal recovery circuit includes
an oscillator that generates a first clock of which a frequency is variable, and
a feedback circuit that controls the oscillator to synchronize the first clock with input data, depending on a phase relationship between the input data and the first clock, the feedback circuit including
an oscillator control circuit that controls the oscillator depending on the phase relationship between the input data and the first clock,
a first phase detection circuit that generates a clock phase control signal depending on the phase relationship between the input data and the first clock,
an output data generation circuit that generates output data by latching the input data at a change edge of the first clock, and
a lock detection circuit that detects whether the signal recovery circuit is in a lock state or a non-lock state, based on a comparison result of the input data and the output data,
the oscillator generates a second clock of which a frequency is the same as that of the first clock, and a phase is different from that of the first clock,
the feedback circuit further includes
a second phase detection circuit that generates a clock phase detection signal depending on a phase relationship between the input data and the second clock, and
a frequency detection circuit that compares the clock phase control signal and the clock phase detection signal, and generates a frequency detection signal indicating a frequency relationship between the input data and the first clock, and
the oscillator control circuit controls the oscillator depending on the clock phase control signal and the frequency detection signal.

6. A signal recovery method which recovers a clock from received input data of a signal recovery circuit, the method comprising:
generating a first clock of which a frequency is variable;
generating a clock phase control signal depending on the phase relationship between the input data and the first clock;
generating output data by latching the input data at a change edge of the first clock;
detecting whether the signal recovery circuit is in a lock state or a non-lock state, based on a comparison result of the input data and the output data;
performing a feedback control that controls the frequency of the first clock to synchronize the first clock with the input data, depending on the clock phase control signal;
generating a second clock of which a frequency is the same as that of the first clock, and a phase is different from that of the first clock;
generating a clock phase detection signal depending on a phase relationship between the input data and the second clock; and
comparing the clock phase control signal and the clock phase detection signal, and generating a frequency detection signal indicating a frequency relationship between the input data and the first clock, the first clock and the second clock are controlled depending on the clock phase control signal and the frequency detection signal.

7. A signal recovery circuit comprising:
an oscillator that generates a first clock of which a frequency is variable; and
a feedback circuit that controls the oscillator to synchronize the first clock with input data, depending on a phase relationship between the input data and the first clock, the feedback circuit includes
an oscillator control circuit that controls the oscillator depending on the phase relationship between the input data and the first clock,
a first phase detection circuit that generates a clock phase control signal depending on the phase relationship between the input data and the first clock,
an output data generation circuit that generates output data by latching the input data at a change edge of the first clock, and
a lock detection circuit that detects whether the signal recovery circuit is in a lock state or a non-lock state, based on a comparison result of the input data and the output data,
the lock detection circuit includes
an input-output data comparison circuit that latches the input data at a change edge of the output data and outputs an input-output data comparison signal,
an averaging circuit that outputs an averaged signal by averaging an amplitude of the input-output data comparison signal,
an amplitude detection circuit that outputs an amplitude signal indicating an amplitude of the averaged signal, by detecting the amplitude of the averaged signal, and
a determination circuit that determines whether a state is the lock state or the non-lock state, based on a comparison result of an amplitude value corresponding to the amplitude signal and a predetermined threshold.

* * * * *